United States Patent [19] [11] Patent Number: 5,451,815
Taniguchi et al. [45] Date of Patent: Sep. 19, 1995

[54] SEMICONDUCTOR DEVICE WITH SURFACE MOUNT PACKAGE ADAPTED FOR VERTICAL MOUNTING

[75] Inventors: Norio Taniguchi, Tanabe; Kazuto Tsuji, Kawasaki; Junichi Kasai, Kawasaki; Michio Sono, Kawasaki, all of Japan

[73] Assignee: Fujitsu Limited, Kawasaki, Japan

[21] Appl. No.: 215,614

[22] Filed: Mar. 22, 1994

[30] Foreign Application Priority Data

Jun. 25, 1993 [JP] Japan ................................. 5-155725

[51] Int. Cl.⁶ ..................... H01L 23/48; H01L 23/12
[52] U.S. Cl. ..................... 257/696; 257/700; 257/731
[58] Field of Search ............... 257/690, 692, 693, 696, 257/700, 712, 713, 731

[56] References Cited

U.S. PATENT DOCUMENTS 5,287,000  2/1994  Takahashi et al. .................. 257/696

FOREIGN PATENT DOCUMENTS 0516096  12/1992  European Pat. Off. ............ 257/723
4-72750   3/1992  Japan ................................. 257/696

OTHER PUBLICATIONS

Patent Abstracts of Japan, vol. 12, No. 130 (E-603) 21 Apr. 1988 & JP-A-62 257 756 (NEC) 10 Nov. 1987.
Patent Abstracts of Japan, vol. 17, No. 13 (E-1304) 11 Jan. 1993 & JP-A-04 243 155 (NEC) 31 Aug. 1992.
Patent Abstracts of Japan, vol. 17, No. 128 (E-1333) 18 Mar. 1993 & JP-A-04 302 495 (Toshiba Lighting & Technol) 26 Oct. 1992.
U.S. Ser. No. 07/881,889 filed May 12, 1992 by Sono et al., assigned by Fujitsu Limited.

*Primary Examiner*—Steven H. Loke
*Attorney, Agent, or Firm*—Staas & Halsey

[57] ABSTRACT

A semiconductor device includes vertical placement part for mounting the semiconductor device on a surface of a circuit board in a vertical position, and a connection part for making electrical connections between the circuit board and a semiconductor element. A stage is provided on which the semiconductor element is placed. The stage has supporting members causing the semiconductor device to vertically stand on the circuit board. Wiring boards, stacked on a side of the stage on which the semiconductor element is placed, have windows in which the semiconductor element is located. The vertical placement part includes wiring lines extending between edges of the wiring boards facing the circuit board and peripheries of the windows. The wiring lines have ends located in the vicinity of the edges of the wiring boards and have a shape enabling the semiconductor device to be mounted on the circuit board.

21 Claims, 11 Drawing Sheets

SEMICONDUCTOR DEVICE WITH SURFACE MOUNT PACKAGE ADAPTED FOR VERTICAL MOUNTING

BACKGROUND OF THE INVENTION

1. Field of the Invention

This invention generally relates to semiconductor devices and, more particularly, to a semiconductor device which can be mounted on a circuit board so that the semiconductor device stands vertically.

In recent years, a surface mounting package has been widely used in which a semiconductor device is soldered on a circuit board, rather than to provide holes made to in the circuit board which are used to solder leads thereon. A package placed vertically on the mounting surface of the circuit board (hereinafter referred to as a "vertical package") is known in order to increase the density of mounting on the circuit board.

It is desired to achieve a package which has the advantages of both the surface mount package and the vertical package.

2. Description of the Prior Art

A semiconductor device having a package structure having the advantage of the surface mount package and the advantage of the vertical package is disclosed in Japanese Laid-Open Patent Publication No. 2-21645. FIG. 1 shows a semiconductor device 1 disclosed in the above application.

In FIG. 1, a resin package 2 houses a semiconductor device 3. Inner lead portions 4a of leads 4 are connected with the semiconductor device 3, and the outer lead portions 4b thereof extend out of the package 2. Further, predetermined tip portions of the outer leads 4b are bent at the same angle.

Spacers 5 are placed on the opposite ends of the section (i.e., edge) of the package from which the outer leads 4b of the package 2 extend. Each of the spacers 5 includes a clip 6 and a cylinder part 7 with the diameter contractible. The spacers 5 are used, as shown in FIG. 2, to mount the semiconductor device 1 on a circuit board 8.

Slots, or holes, 8a, with which the relevant cylinder parts 7 are to be engaged are formed on the circuit board 8. The semiconductor device 1 is made to stand vertically on the circuit board 8 by engaging the cylinder parts 7 with the slots 8a of the spacers 5. The outer leads 4b are soldered to a pattern 8b formed on the circuit board 8.

However, with the semiconductor package 1, the slots 8a are needed to vertically place the semiconductor packages 1 on the circuit board 8. Unlike normal surface mount packaging, the holes 8a have to be formed before mounting. This is a problem because it reduces mounting efficiency.

Also, as shown in FIG. 2, the outer lead 4b extends for a relatively long distance toward the circuit board 8 and is bent. The bent portion of the outer leads 4b is soldered to the pattern 8b formed on the circuit board 8. That is, the outer lead 4b has a long portion extending out of package 2. External disturbances may enter through this exposed portion, which may prevent favorable transmission of signals between the semiconductor device 1 and the circuit board 8.

The applicant has proposed, as set forth in Japanese Laid-Open Patent Application No. 4-52434, a semiconductor device with a structure in which a resin package is placed vertically on a circuit board and connection leads are bent in the vicinity of the resin package in order to support the resin package with supporting leads extending in opposite directions from each other.

However, with the demand for down-sizing of electronic devices in recent years, there has been a increasing demand for down-sizing of semiconductor devices, which are structural components, and thereby to achieve an increase in the integration density. The demand for the increased density has been accommodated by efforts toward providing an increased number of pins. Particularly, in packages having a large number of pins, such as a QFP (Quad flat package) and PGA (Pin Grid Array), an effort has been made to reduce the terminal pitches and increase the number of pins in order to enhance the integration density.

However, since the packages proposed by the above Japanese publication and application use a single in-line package, there is a potential problem in that the increased number of pins will elongate the package in the direction of pin alignment and that the resulting extended mounting area on the circuit board will make it difficult to mount the device on a smaller circuit board.

SUMMARY OF THE INVENTION

It is a general object of the present invention to provide a semiconductor device in which the above disadvantages are eliminated.

A more specific object of the present invention is to provide a multiple-pin semiconductor device which can be mounted on a small circuit board and contributes to down-sizing of electronic devices.

The above objects of the present invention are achieved by a semiconductor device comprising: vertical placement means for mounting the semiconductor device on a surface of a circuit board in a vertical position; connection means for making electrical connections between the circuit board and a semiconductor element; a stage on which the semiconductor element is placed, the stage having supporting members causing the semiconductor device to vertically stand on the circuit board; and wiring boards stacked on a side of the stage on which the semiconductor element is placed, the wiring boards having windows in which the semiconductor element is located. The vertical placement means comprises wiring lines extending between edges of the circuit boards facing the circuit board and peripheries of the windows. The wiring lines have ends located in the vicinity of the edges of the circuit boards and have a shape enabling the semiconductor device to be mounted on the circuit board.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
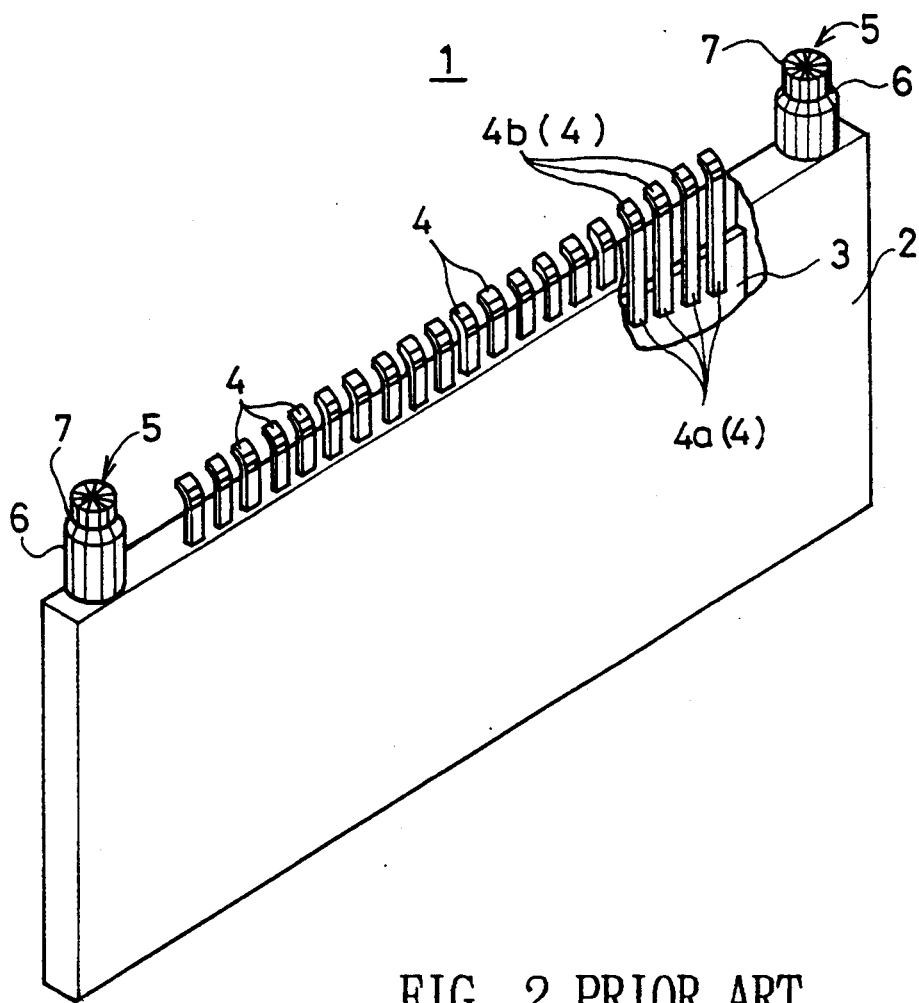
FIG. 1 is a perspective view of an overall conventional semiconductor device.
Figure 2:
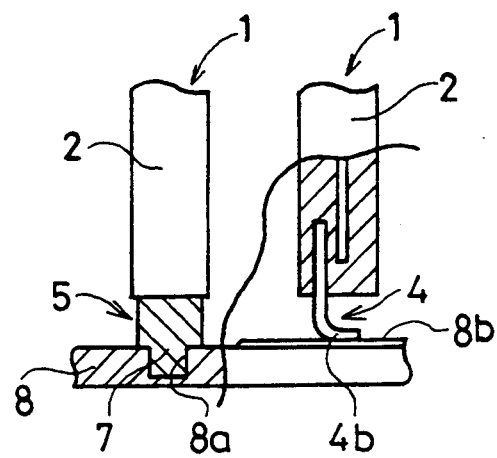
FIG. 2 is a diagram showing mounting of the semiconductor device shown in FIG. 1 on a printed circuit board.
Figure 3:
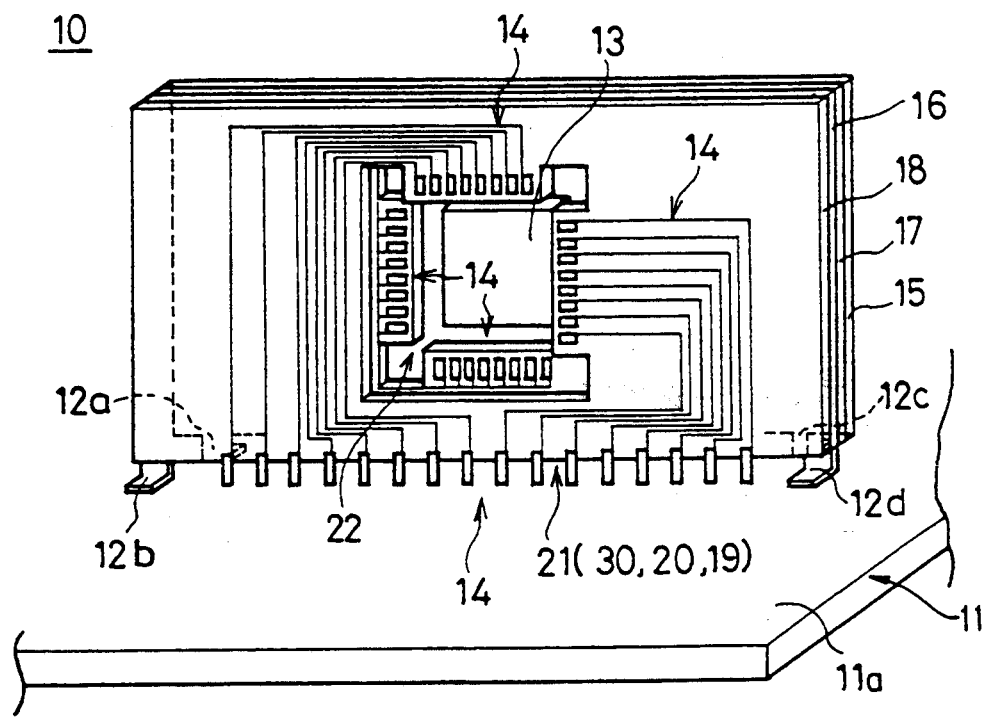
FIG. 3 is a perspective view of an overall semiconductor device according to a first embodiment of the present invention.
Figure 4:
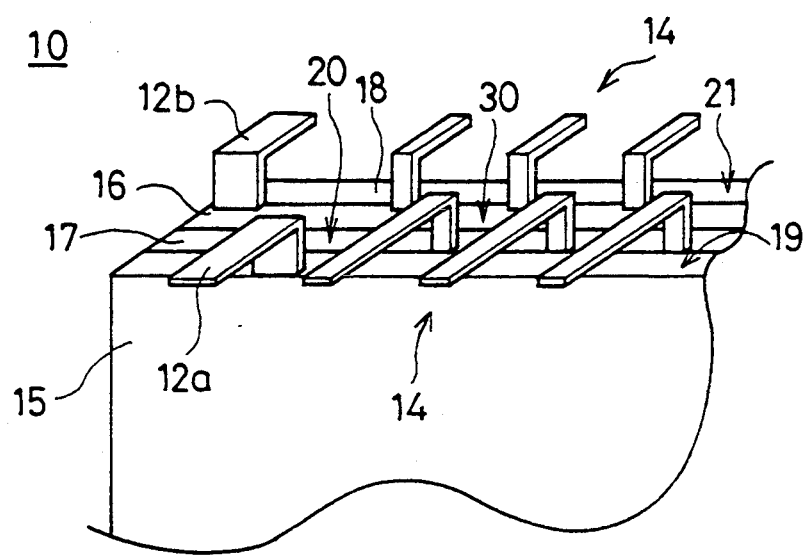
FIG. 4 is a perspective view of part of the first embodiment of the present invention.

FIG. 3 is a perspective view of the whole of the first embodiment of the invention. FIG. 4 is an enlarged, perspective view of a part of the first embodiment of the invention.

As shown in FIG. 3, a semiconductor device 10 is of a vertical structure, and has supporting members 12a, 12b, 12c, and 12d bent into an L-shape to enable vertical mounting of the semiconductor device 10 on the mounting surface 11a of a circuit board 11. As will be explained below, the semiconductor device 10 comprises a metallic stage 15, a metallic plate 16, and single-layered printed wiring boards 17 and 18 in a stacked configuration. The supporting members 12a and 12c are formed as a single unit with the metallic stage 15, and the supporting members 12b and 12d are formed as a single unit with the metallic plate 16.

A semiconductor element (chip) 13 is placed in the central position on the surface of the metallic stage 15. A window 22 is created in the metallic plate 16 and the printed wiring boards 17 and 18, and is located in a position corresponding to the position of the semiconductor element 13. On the printed circuit boards 17 and 18, printed wiring lines (interconnections) 14 are formed, which extend from the periphery of the window 22 to edges 20 and 21 of the boards 17 and 18 facing the circuit board 11.

One end of each of the wiring lines 14 is wire-bonded to the semiconductor element 13 by a bonding wire (not shown). As shown in FIG. 4, the other ends of the wiring lines 14 have L-shaped portions which are located in the vicinity of the edges 20 and 21 of the printed wiring boards 17 and 18 facing the circuit board 11 and which extend in opposite directions along with the supporting members. The above structure enables flexible mounting on the mounting surface of the circuit board 11. The semiconductor element 13 is sealed by resin potting.

Figure 5:
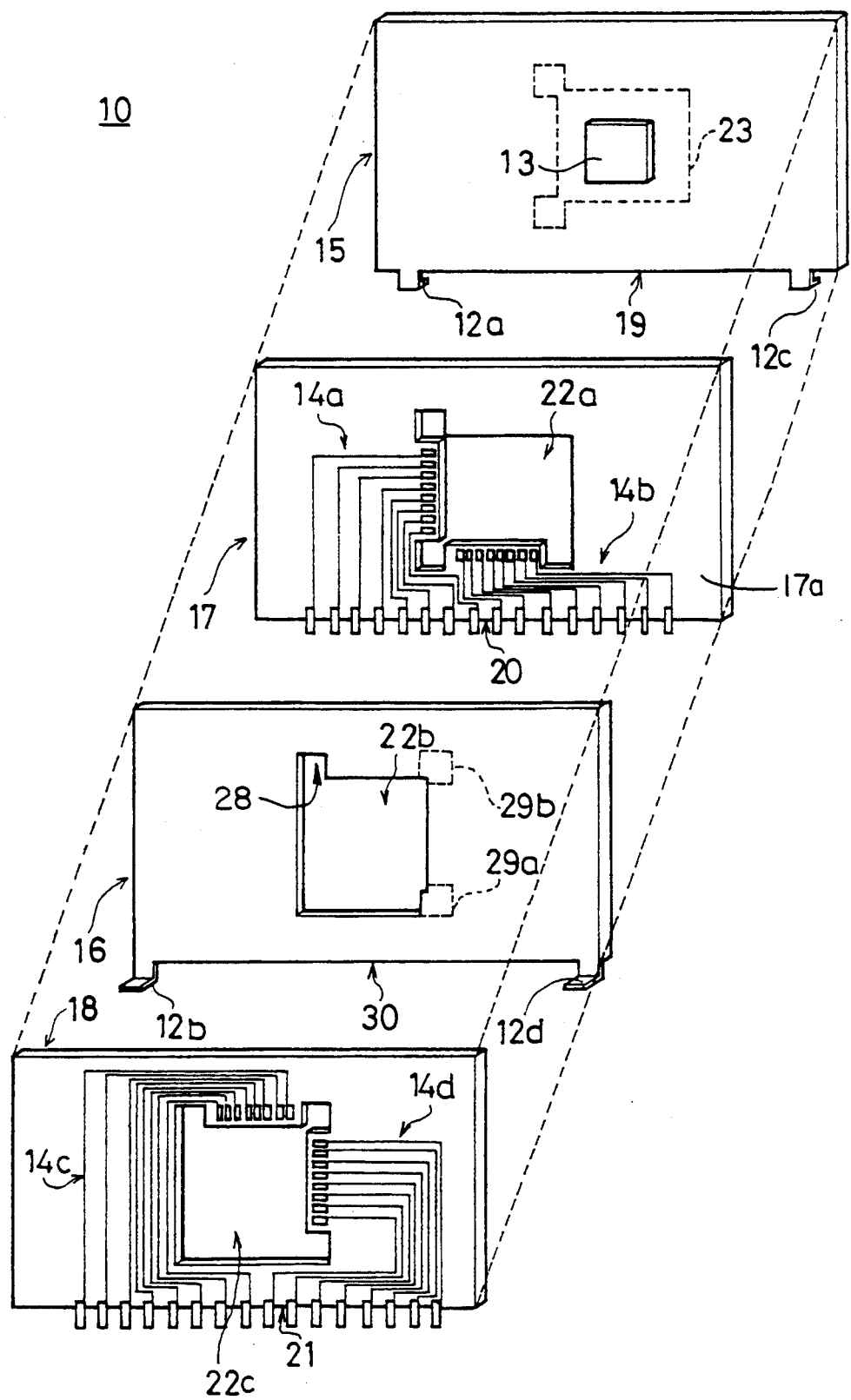
FIG. 5 is an exploded perspective view of the first embodiment of the present invention.

FIG. 5 is an exploded perspective view of the first embodiment of the invention, and FIGS. 6 through 9 are plan views of the metallic stage 15, the printed wiring board 17, the metallic plate 16, and the circuit board 18, respectively.

Figure 6:
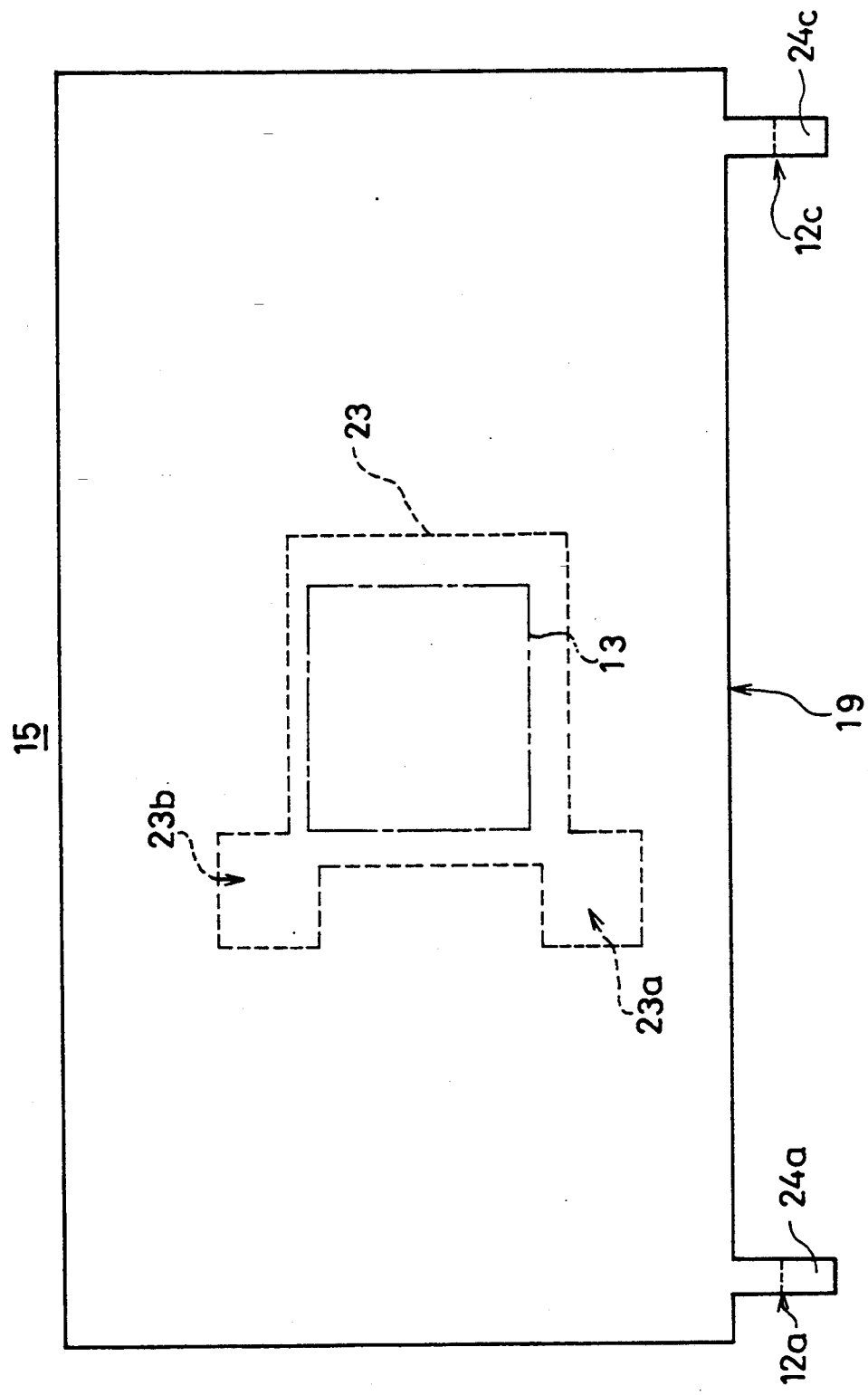
FIG. 6 is a plan view of a metallic stage used in the first embodiment of the present invention.

As shown in FIGS. 5 and 6, the metallic stage 15, on which semiconductor element 13 is mounted, is of an approximately rectangular shape. The supporting members 12a and 12c project from the long edge 19 of the metallic stage 15 facing the circuit board 11. The supporting members 12a and 12c are bent into L-shapes in the position indicated by a dotted line. Hence, the supporting members 12a and 12c respectively have contact surfaces 24a and 24c, which come into contact with the circuit board 11.

As indicated by the broken line, the mounting area 23 formed on the center surface portion of the metallic stage 15 is plated with palladium (Pd), gold (Ag) or silver (Au). Accordingly, the semiconductor element 13 can be mounted and wire-bonded on the mounting area 23.

Figure 7:
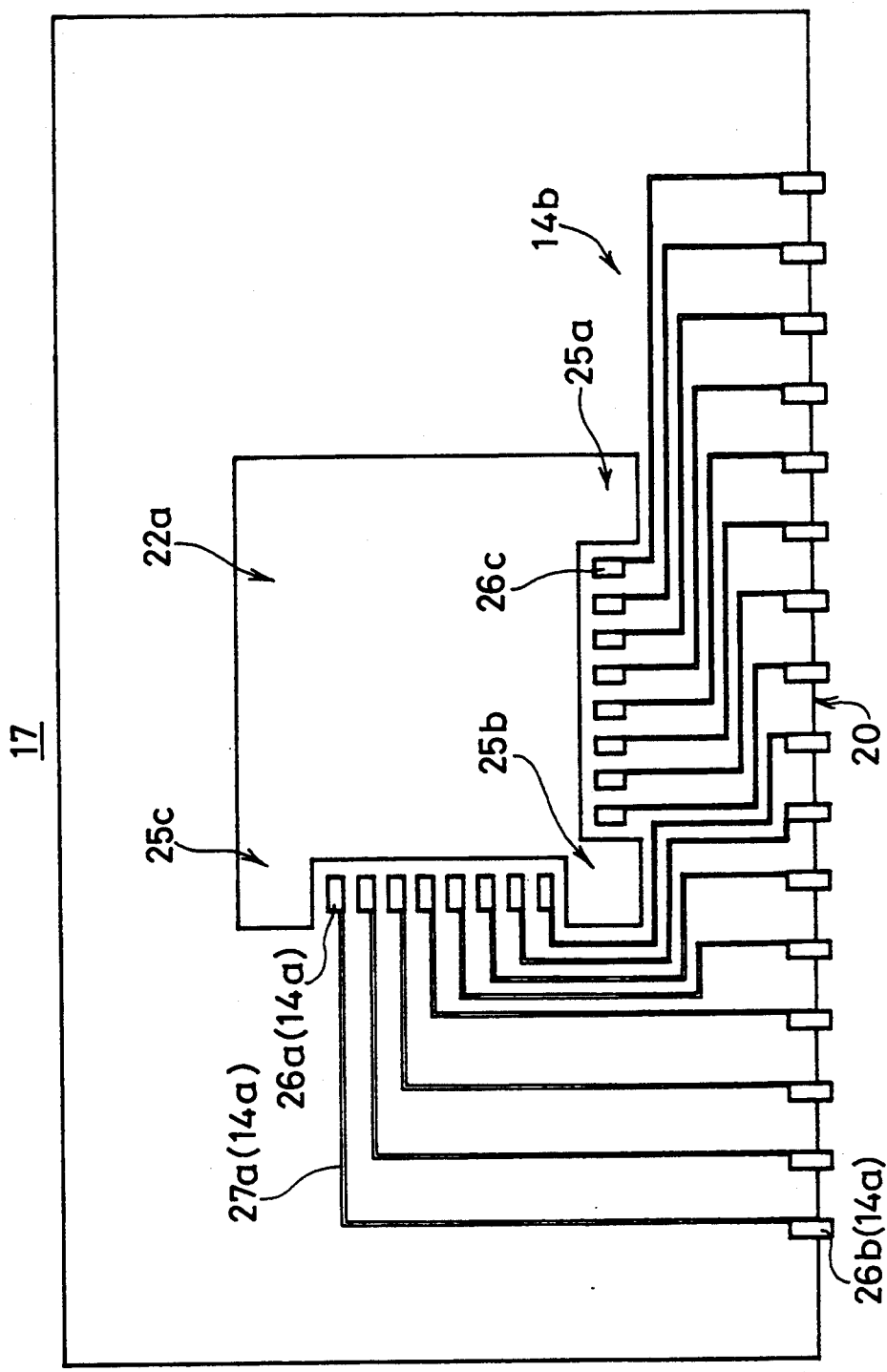
FIG. 7 is a plan view of a printed circuit board used in the first embodiment of the present invention.

As shown in FIGS. 5 and 7, the printed wiring, or circuit, board 17, stacked on the front surface of the metallic stage 15, is nearly rectangular, with a window 22a formed in the middle of its surface. Areas 25a, 25b and 25c are cut out of three corners of the window 22a, which is nearly square in shape.

The printed circuit board 17 is structured so that, when it is stacked onto the metallic stage 15, extensions 23a and 23b of the mounting area 23 on the metallic stage 15 can be seen through the cutout sections 25b and 25c, respectively.

A plurality of conductor pads 26a are aligned along the left edge of the window 22a. The conductor pads 26a are connected via intermediate patterns 27 to conductor pads 26b arranged in a line along the long edge 20, which faces the circuit board 11. The conductor pads 26a and 26b and the intermediate patterns 27 form the printed wiring lines 14a. Similarly, the printed wiring lines 14b are formed to extend between the lower edge of the window 22a and the edge 20, which faces the circuit board 11.

As compared to other printed wiring lines (printed wiring lines 14a, and printed wiring lines 14c and 14d which will be described later), the printed wiring lines 14b have the shortest path. Hence, the printed wiring lines 14b are used for signals required to be transferred with the fastest response.

Figure 8:
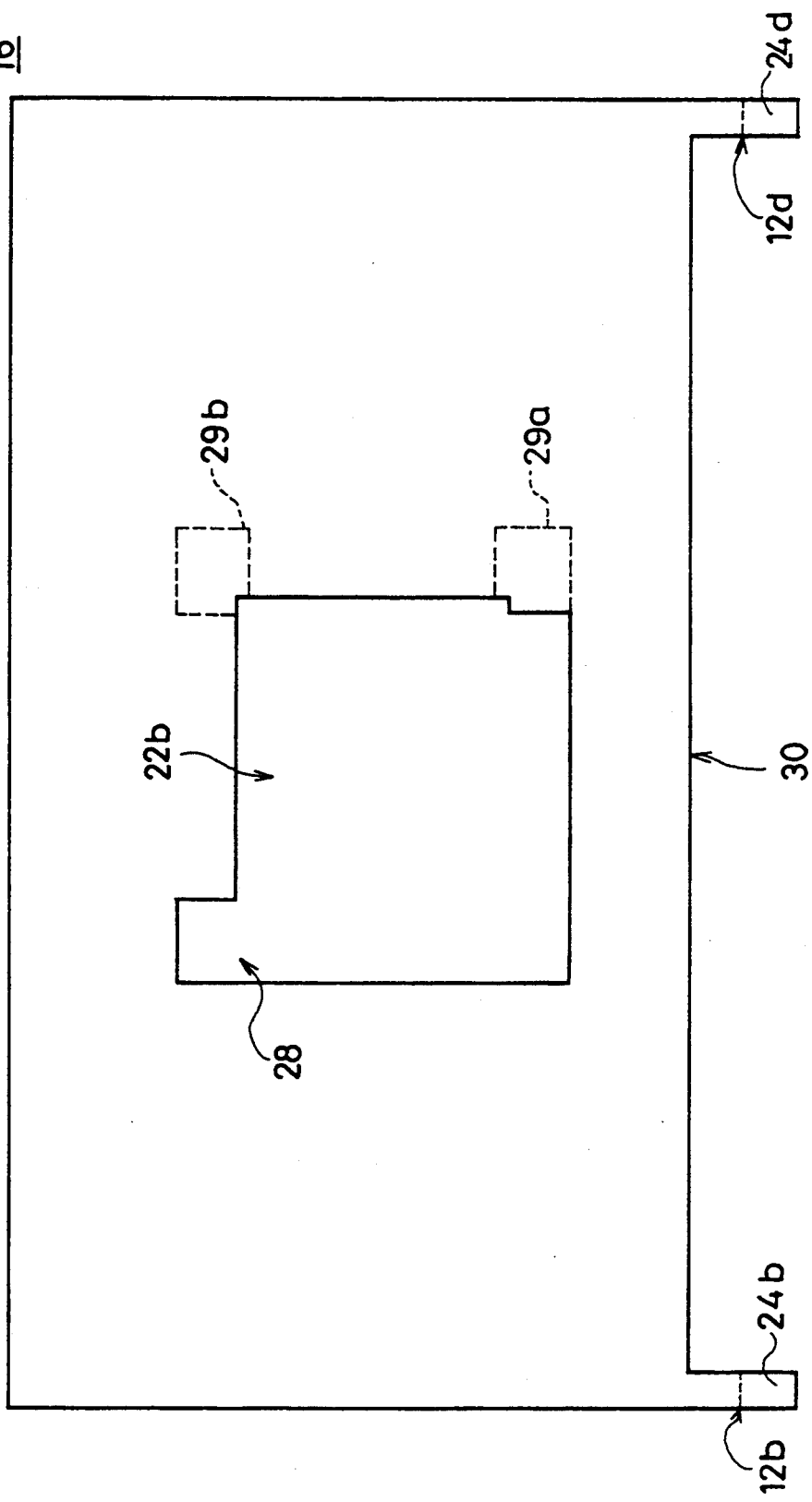
FIG. 8 is a plan view of a metallic plate used in the first embodiment of the present invention.

As shown in FIGS. 5 and 8, the metallic plate 16 stacked on the main surface side 17a of the printed circuit board 17 (i.e., the side 17a on which the printed wiring lines are formed) is of an approximately rectangular shape, and a window 22b is formed in the metallic plate 16 and is located in the center surface portion thereof. The window 22b is of a nearly square shape, and has a cutout portion 28 formed in one corner thereof.

Further, the window 22b has two mounting portions 29a and 29b formed in the vicinity of two other corners. The mounting portions 29a and 29b are plated with palladium (Pd), gold (Au), copper (Cu) or other metallic materials, so that wire bonding is possible.

As shown in FIG. 8, the supporting members 12b and 12d project from the two corners of the long edge 30 of the metallic plate 16 that faces the circuit board 11 and are bent in an L-shape in the position indicated by a broken line. Hence, the supporting members 12b and 12d respectively have contact surfaces, which come into contact with the circuit board 11.

The supporting members 12b and 12d are formed so that when the metallic plate 16, the printed wiring board 17, and the metallic stage 15 are stacked, the supporting members 12b and 12d are located in positions different from those of the supporting members 12a and 12d of the metallic stage 15.

As shown in FIG. 5, the window 22b of plate 16 formed so that the mounting area 23 of the metallic stage 15, the conductor pads 26a of the printed wiring lines 14a on the printed wiring board 17, and the conductor pads 26c of the printed wiring lines 14b on the printed wiring board 17 can be seen through the window 22b.

Figure 9:
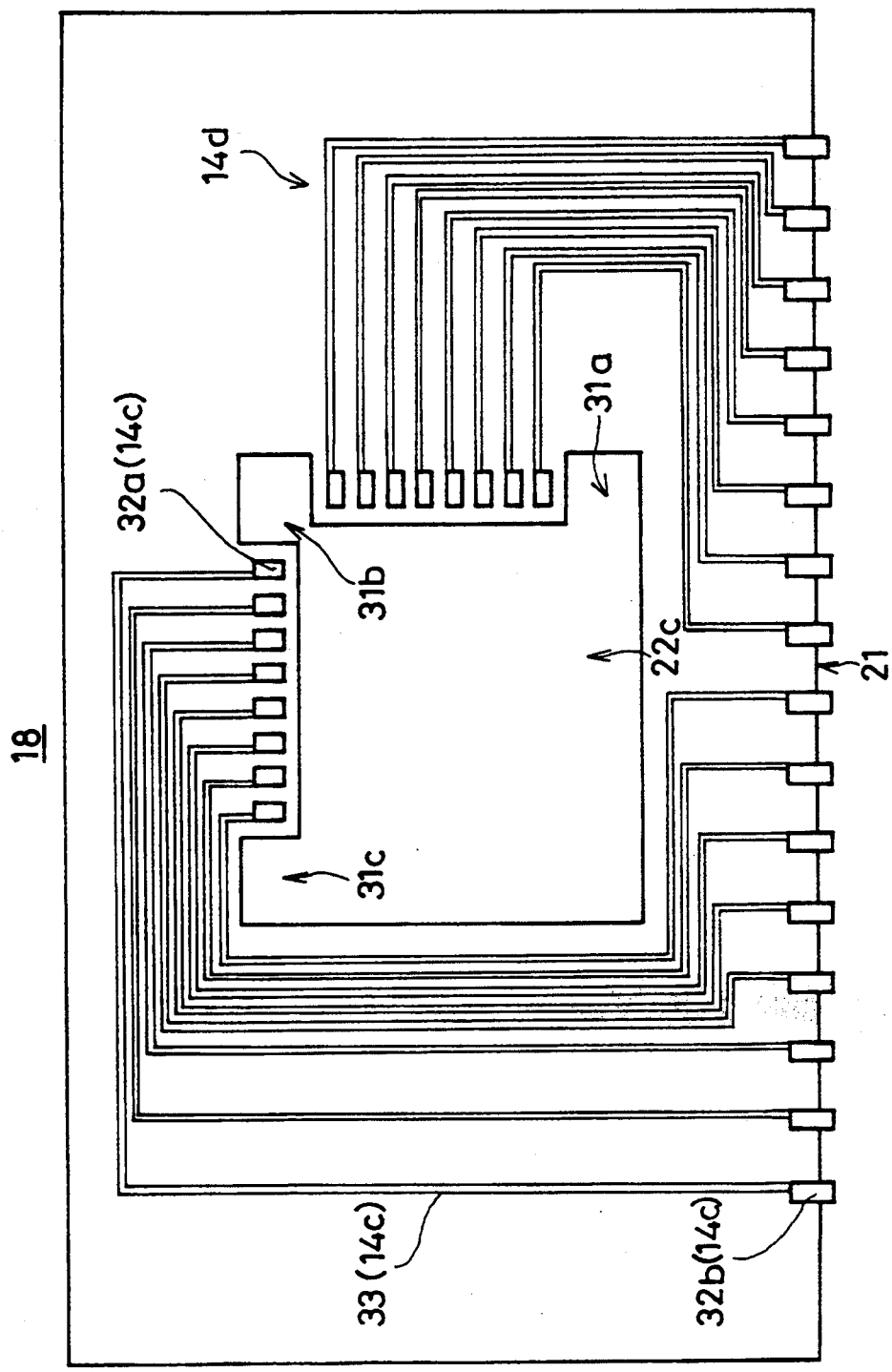
FIG. 9 is a plan view of a printed circuit board used in the first embodiment of the present invention.

Further, as shown in FIGS. 5 and 9, the printed wiring board 18, which is stacked on the front surface of the metallic plate 16, is of a nearly rectangular shape. A window 22c is formed in the metallic plate 16 and is located in the center surface portion thereof. The window 22c is of a nearly square shape, and has cutout portions 31a, 31b, and 31c respectively formed in the three corners of the window 22c.

When the printed wiring board 18 is stacked together with the metallic stage 15, the printed circuit board 17 and the metallic plate 16, contact surfaces 29a and 29b can be seen via the cutout portions 31a and 31b.

As shown in FIG. 7, the window 22b is formed so that the extensions 23a and 23b of the mounting area 23 of the metallic stage 15, the conductor pads 26a of printed wiring lines 14a of the printed circuit board 17, and the conductor pads 26c of the printed wiring lines 14b thereof can be seen through the window 22c.

A plurality of conductor pads 32a are aligned along the upper edge of the window 22c, as seen in FIG. 9. The conductor pads 32a are connected via intermediate patterns 33 to conductor pads 32b which are aligned along the long edge 21 of the printed wiring board 18 and face the circuit board 11. The conductor pads 32a and 32b and the intermediate patterns 33 form the printed wiring lines 14c. Similarly, printed wiring lines 14d are formed so that they extend from the right edge of the window 22c to the edge 21 of the printed wiring board 18.

The printed wiring lines 14c and 14d along the edge 21 of the printed wiring board 18 are located in a zigzag (staggered) manner with respect to the printed wiring lines 14a and 14b of the printed wiring board 17. Further, the end portions of the printed wiring lines 14a, 14b, 14c and 14d are bent into L-shapes so that the lines 14c and 14d extend in the direction opposite to the direction in which the lines 14a and 14b extend.

Figure 10:
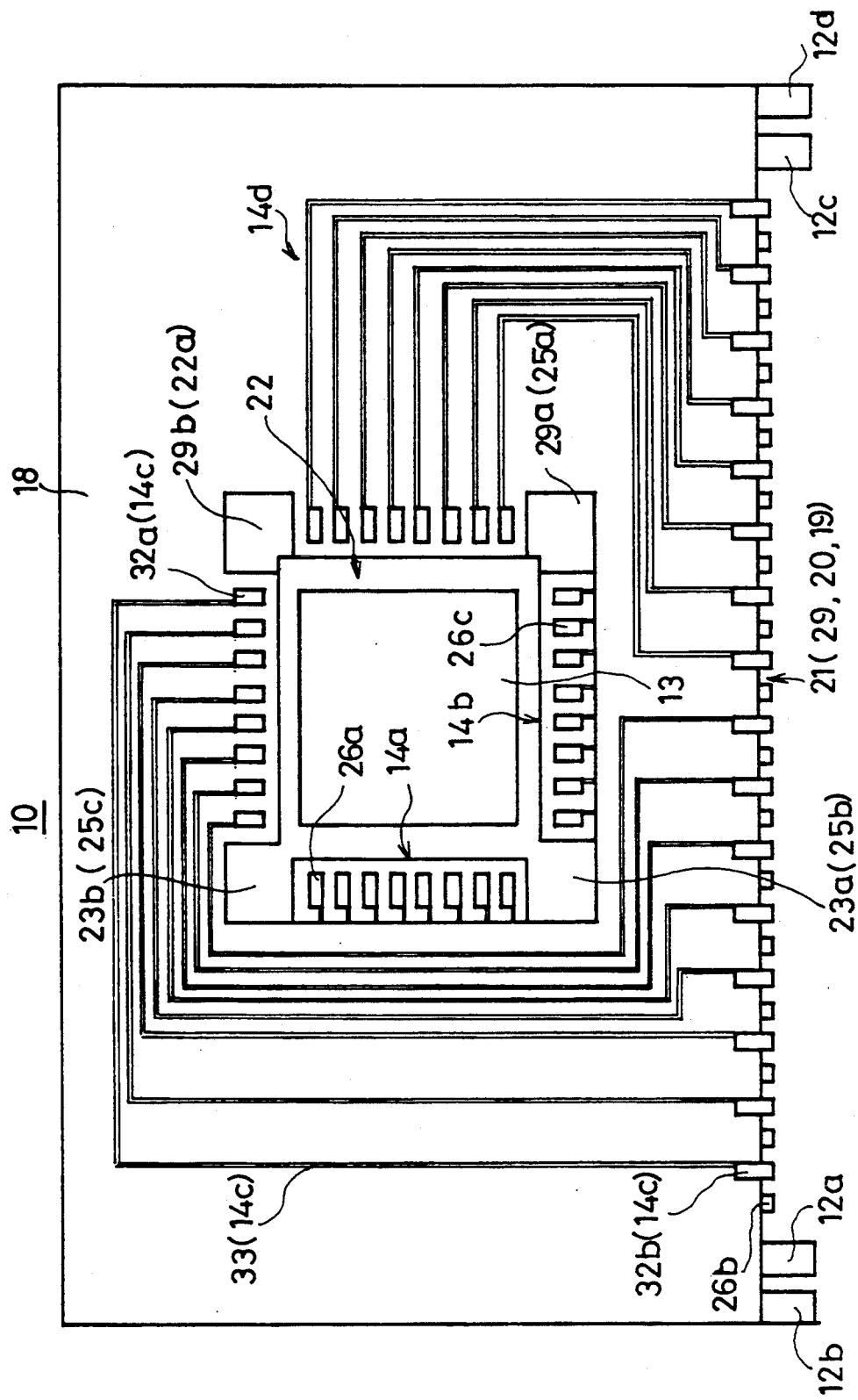
FIG. 10 is a plan view of the overall semiconductor device according to the first embodiment of the present invention.

The metallic stage 15, the printed wiring board 17, the metallic plate 16, and the printed wiring board 18 are stacked in that order as shown in FIG. 10, which provides a plan view of the semiconductor device 10.

As has been described previously with reference to FIG. 3, the semiconductor device 10 has the vertical structure in which the device 10 is vertically mounted on the mounting surface of the circuit board 11 and the printed wiring lines are arranged in two lines in zigzag form.

According to the first embodiment of the present invention, it is possible to provide a large number of pins without an increase in the length of the package in the direction in which the pins are arranged and thus to mount the semiconductor device 10 with a mounting length equal to that needed to mount a single in-line package device. Hence, the semiconductor device 10 can be mounted on a compact circuit board.

Further, the use of single-layered printed wiring boards reduces material costs and facilitates the formation of printed wiring lines, so that the production cost can be reduced. Furthermore, the metallic stage 15 forms the back surface of the semiconductor device 10, so that heat generated by the semiconductor element 13 can be effectively and efficiently radiated. Moreover, the metallic stage and the metallic plate are plated to be stacked in a bondable state and thus they serve as a low-impedance grounding layer or power supply layer and contribute to improvements in the electrical characteristics.

Figure 11:
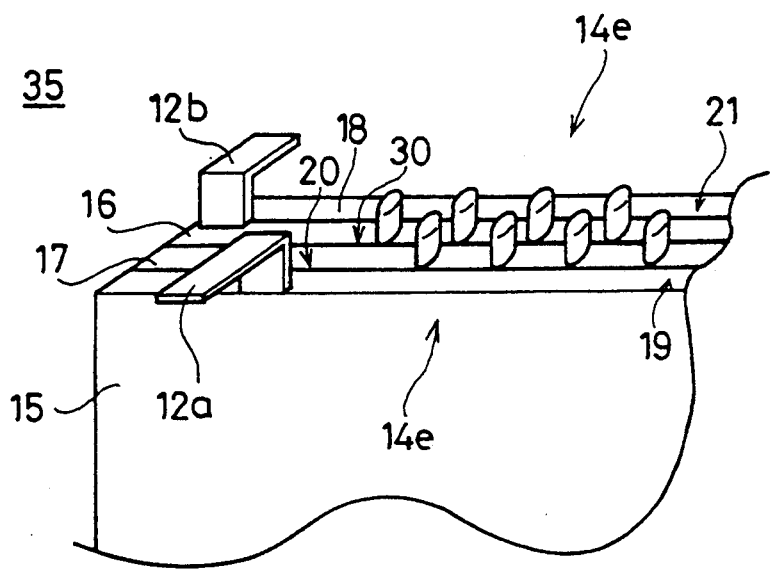
FIG. 11 is a perspective view of a variation of the first embodiment of the present invention.

FIG. 11 is a perspective view of an essential part of a variation of the first embodiment of the present invention. A semiconductor device 35 shown in FIG. 11 has printed wiring lines 14c having cylindrical ends located in the vicinity of the edges 20 and 30 facing the circuit board 11. The contact surfaces of the printed circuit lines 14e that come into contact with the circuit board 11 are of a nearly circular shape.

Figure 12:
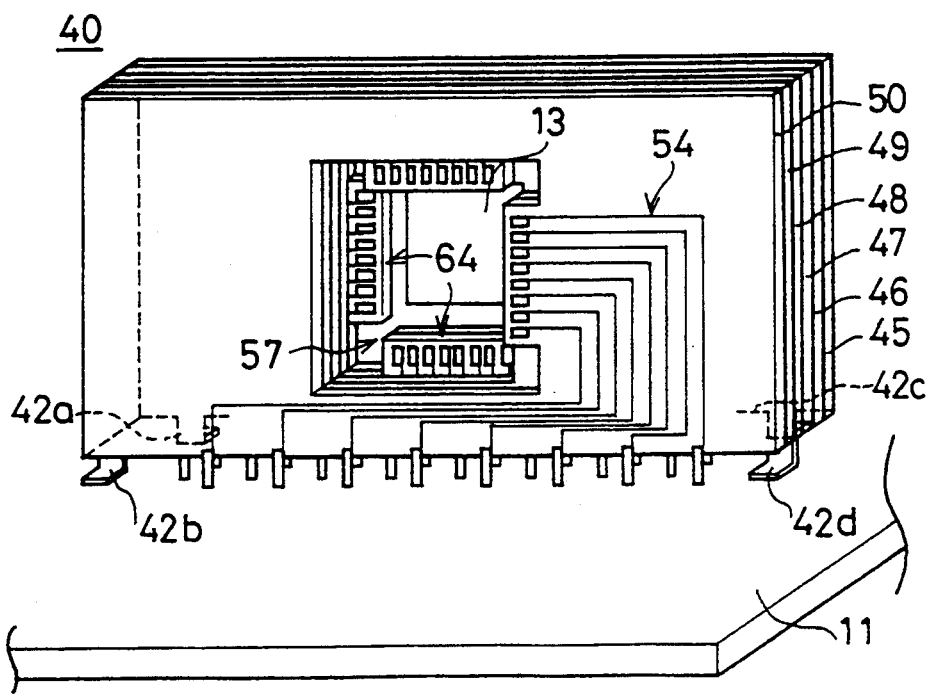
FIG. 12 is a perspective view of an overall semiconductor device according to a second embodiment of the present invention.
Figure 13:
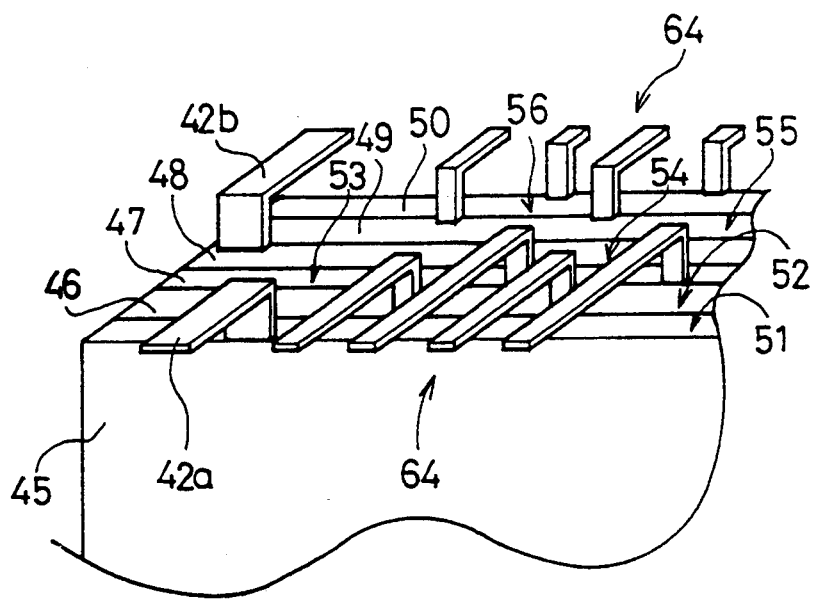
FIG. 13 is a perspective view of a part of the second embodiment of the present invention.
Figure 14:
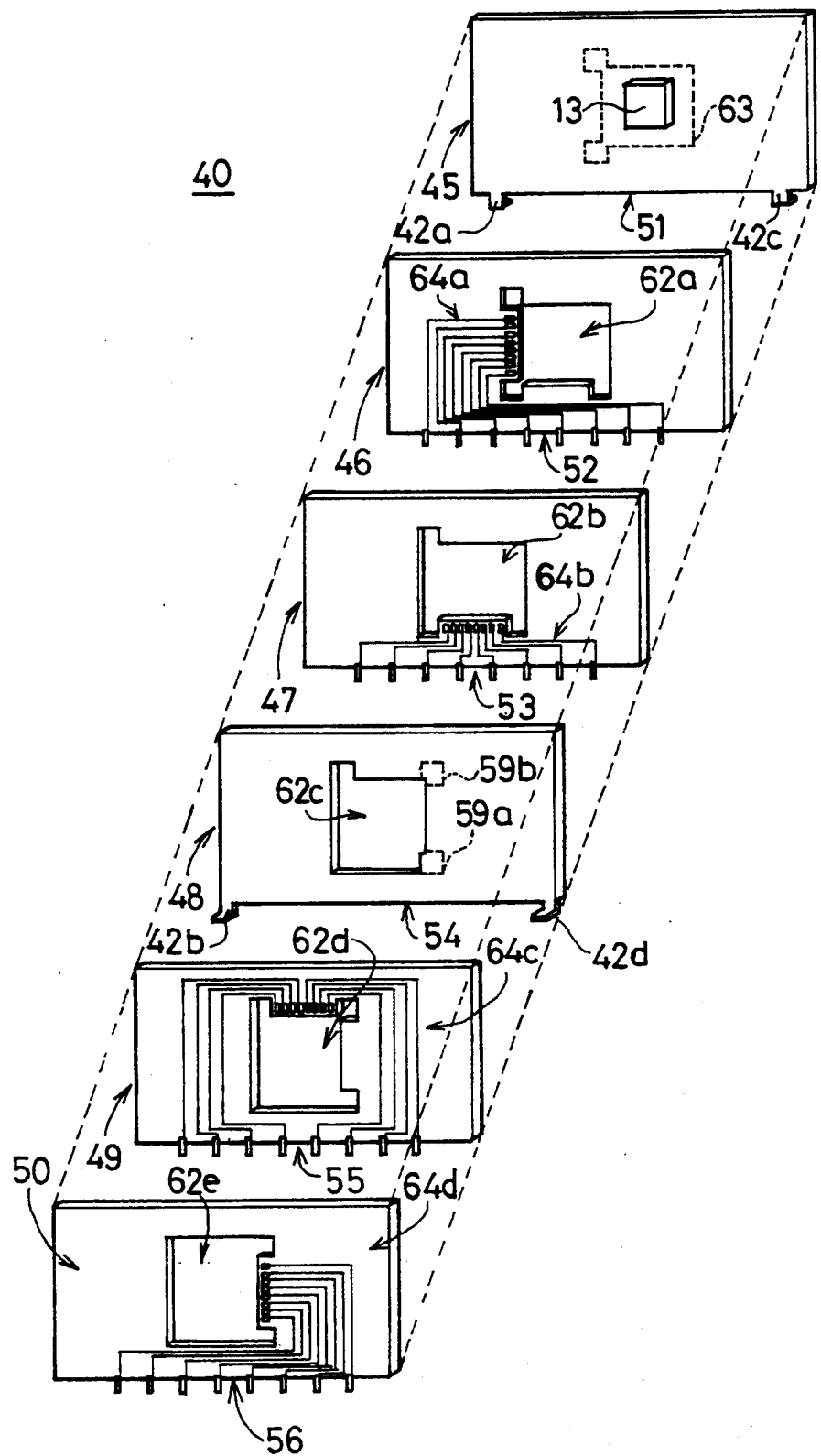
FIG. 14 is an exploded, perspective view of the second embodiment of the present invention.

FIG. 12 is a perspective view of the whole of the second embodiment of the invention. FIG. 13 is an enlarged, perspective view of a part of the second embodiment of the invention. FIG. 14 is an exploded, perspective view of the second embodiment of the present invention. The second embodiment of the present invention will be described with reference to FIGS. 12 through 14.

As shown in FIG. 12, a semiconductor device 40 according to the third embodiment of the present invention has a vertical structure and is supported by supporting members 42a, 42b, 42c, and 42d, each of which members is bent in an L-shape. The semiconductor device 40 is vertically mounted on the mounting surface of the circuit board 11.

The semiconductor device 40 includes a metallic stage 45, a single-layer printed circuit board 46, a single-layer printed circuit board 47, a metallic plate 48, a single-layer printed circuit board 49 and a single-layer printed circuit board 50 stacked in this order. Supporting members 42a and 42c are integrated with the metallic stage 45, and supporting members 42b and 42d are integrated with the metallic plate 48.

The semiconductor element 13 is mounted on the center surface portion of the metallic stage 45. Windows 62c, 62a, 62b, 62d, and 62e (see, FIG. 14) are formed in the metallic plate 48 and the printed wiring boards 46, 47, 49, and 50, and are located at respective positions corresponding to the position of the semiconductor element 13.

On the printed wiring boards 46, 47, 49, and 50, printed wiring lines 64a, 64b, 64c, and 64d, which are connection means, are formed so as to extend from the areas around windows 62a, 62b, 62d, and 62e to edges 52, 53, 55, and 56 facing the board 11, respectively.

First-ends of the printed wiring lines 64a, 64b, 64c, and 64d are wire-bonded to the semiconductor element 13 by means of bonding wires (not shown). The other, or second, ends of the printed wiring lines 64a, 64b, 64c and 64d are bent in the vicinity of the edges 52, 53, 55 and 56 of the boards 46, 47, 49 and 50 facing the circuit board 11, so that the lines 64a and 64b and the supporting members 42a and 42c extend in the direction opposite to that in which the lines 64c and 64d and the supporting members 42b and 42d extend. The above structure enables flexible surface mounting on the mounting surface of the circuit board 11.

The wire-bonded semiconductor element 13 is sealed by resin potting. As in the case of the first embodiment of the present invention, the semiconductor device 40 includes a mounting portion 63 and contact portions 59a and 59b, on which the semiconductor element 13 can be mounted. The portions 63, 59a and 59b are plated with palladium (Pd), gold (Au), silver (Ag), or other metals to allow wire bonding.

As has been described, the semiconductor device 40 has the vertical structure in which the device 40 is vertically mounted on the mounting surface of the circuit board 11 and the printed wiring lines are arranged in four lines in double zigzag form.

According to the second embodiment of the present invention, as compared with the first embodiment of the present invention, it is possible to provide a large number of pins without an increase in the length of the package in the direction in which the pins are arranged and mount the semiconductor device 40 with a mounting length equal to that needed to mount a single in-line package device. Hence, the semiconductor device 40 can be mounted on a compact circuit board. Further, the second embodiment of the present invention has advantages in terms of the production cost, electrical characteristics, and heat generation effects, as in the case of the first embodiment of the present invention.

Figure 15:
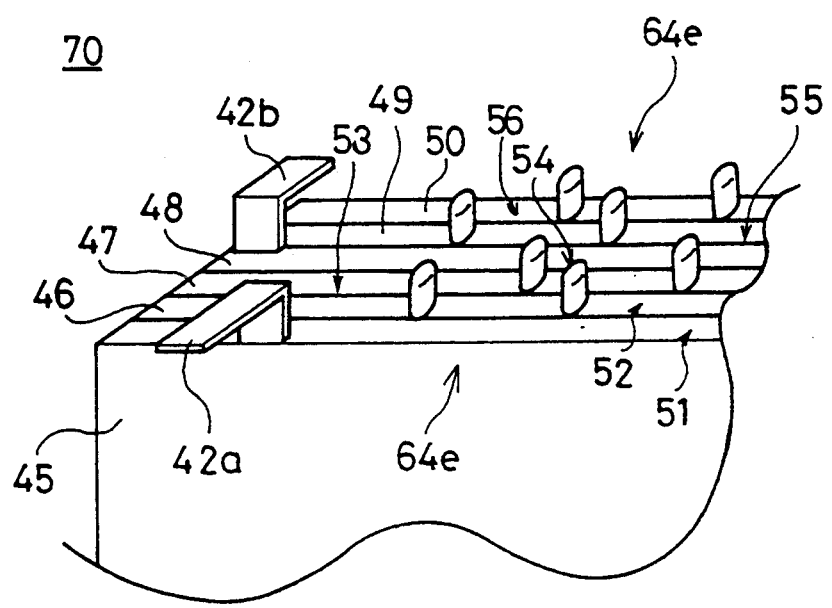
FIG. 15 is a perspective view of an essential part of a variation of the second embodiment of the present invention.

FIG. 15 is a perspective view of the main parts of a variation of the second embodiment of the present invention. A semiconductor device 70, shown in FIG. 15, has printed wiring lines 64e having cylindrical ends located in the vicinity of the edges 52, 53, 55 and 56 facing the circuit board 11. Hence, the printed wiring lines 64e have approximately circular contact surfaces, which come into contact with the printed circuit board 11.

Now, if the metallic stage forms the rearmost surface of the semiconductor device, the stacking order of the printed wiring boards and the metallic plate need not be limited to the stacking order of the first and second embodiments of the present invention, and these parts need not be of a rectangular shape.

According to the present invention, the metallic stages are vertically mounted on the mounting surface of the circuit board and a plurality of printed circuit boards are serially stacked on the metallic stage. Further, interconnection means (printed wiring lines) are provided between the edges of the respective printed circuit boards facing the circuit board and the peripheries of the windows formed in the respective printed circuit boards, and the ends of the interconnection means facing the circuit board are arranged and formed so that surface mounting of the printed circuit boards can be flexibly carried out. Hence, a large number of pins can be accommodated without an increase in the length of the package in which the pins are arranged in a line or lines with a high density and without an increase in the mounting length on the circuit board. Hence, the semiconductor devices of the present invention can be mounted on compact circuit boards.

The present invention is not limited to the specifically disclosed embodiments, and variations and modifications may be made without departing from the scope of the present invention.

What is claimed is:

1. A semiconductor device comprising:
   a semiconductor element;
   a stage having a side and a first edge, the stage supporting the semiconductor element on the side thereof and such that the semiconductor element is vertically oriented relatively to, and disposed above, a horizontally oriented circuit board and with the first edge of the stage facing and displaced from the horizontally oriented circuit board;
   a stacked layer structure having a plurality of wiring boards arranged in a stacked formation and a plate layer, having a second edge, the stacked layer structure being supported on the side of the stage adjacent the semiconductor element and each of the wiring boards comprising plural wiring lines making corresponding, plural external connections with the semiconductor element; and
   first supporting members extending, in spaced relationship, from the first edge of the stage and second supporting members extending, in spaced relationship, from the second edge of the plate layer, the first and second supporting members commonly extending toward the circuit board and having respective first and second portions extending in respective and different, first and second directions parallel to the surface of, and contacting, the circuit board thereby to support the semiconductor device in the vertically oriented position thereof above the circuit board.

2. The semiconductor device as claimed in claim 1, wherein the first direction of the first portions of the first supporting members is opposite to the second direction of the second portions of the second supporting members.

3. The semiconductor device as claimed in claim 2, wherein:
   the stage with the stackedlayer structure supported thereon, together, define first and second spaced main surfaces of the semiconductor device; and
   the respective first and second portions of the first and second support members extend transversely to, and beyond, the corresponding first and second main surfaces of the semiconductor device.

4. The semiconductor device as claimed in claim 1, wherein:
   the stage with the stacked layer structure supported thereon, together, define first and second spaced main surfaces of the semiconductor device; and
   the respective first and second portions of the first and second support members extend transversely to, and beyond, the corresponding first and second spaced main surfaces of the semiconductor device.

5. The semiconductor device as claimed in claim 1, wherein each of the first and second supporting members has an approximately L-shaped configuration.

6. The semiconductor device as claimed in claim 1, wherein the stacked layer structure has a window therein, within which the semiconductor element is located and received when the stacked layer structure is supported on the stage having the semiconductor element supported thereon and such that the stacked layer structure is in surrounding relationship relative to the semiconductor element.

7. The semiconductor device as claimed in claim 1, wherein the first and second portions of the first and second supporting members extend transversely to the corresponding first and second edges, respectively, of the stage and the at least one plate layer.

8. The semiconductor device as claimed in claim 1, wherein:
   the semiconductor element has at least two sides; and
   the plural wiring lines of each wiring board are arranged in plural groups, each group comprising plural wiring lines and disposed to make external connections with the semiconductor element at a corresponding side thereof.

9. The semiconductor device as claimed in claim 1, wherein each of the wiring lines has an end and the ends of the wiring lines extend beyond the respective first and second edges of the stage and the plate layer.

10. The semiconductor device as claimed in claim 1, wherein the plate layer is interposed between two wiring boards of the stacked layer structure.

11. The semiconductor device as claimed in claim 1, wherein:
the first supporting members extend from respective, first and second opposite end portions of the stage and define a central portion of the first edge of the stage therebetween; and
the second supporting members extend from respective first and second opposite end portions of the second edge of the plate layer and define a central portion of the second edge of the plate layer therebetween.

12. The semiconductor device as claimed in claim 11, wherein:
each wiring board has a respective third edge, corresponding to the first edge of the stage and the second edge of the plate layer, having opposite end portions defining therebetween a central portion, corresponding respectively to the opposite end portions and the central portion of each of the first and second edges; and
the wiring lines of each wiring board include end portions extending from the third edge thereof and disposed in spaced relationship along the central portion of the third edge thereof.

13. The semiconductor device as claimed in claim 1, wherein said wiring lines comprise signal wiring lines which are formed on the plurality of wiring boards and are used to carry signals required for a selected high response.

14. The semiconductor device as claimed in claim 1, wherein said stage comprises a metallic plate.

15. The semiconductor device as claimed in claim 1, wherein the plate layer comprises a metallic plate.

16. The semiconductor device as claimed in claim 1, wherein each of the first and second supporting members is an integral portion of the respectively corresponding stage and the plate layer.

17. The semiconductor device as claimed in claim 1, wherein the wiring lines comprise approximately cylindrical portions which are of a length, and are disposed, so as to contact the circuit board when the semiconductor device is supported thereon.

18. The semiconductor device as claimed in claim 1, wherein the wiring lines comprise lead-shaped portions.

19. The semiconductor device as claimed in claim 1, wherein said semiconductor element comprises a semiconductor chip.

20. A semiconductor device comprising:
a semiconductor element;
a stage having a side and a first edge, the stage supporting the semiconductor element on the side thereof and the semiconductor element thereby being vertically oriented relatively to, and disposed above, a horizontally oriented circuit board;
a stacked layer structure having a plurality of wiring boards and a plate layer arranged in a stacked formation and having a second edge, the stacked layer structure being supported on the side of the stage adjacent the semiconductor element and each of the wiring boards comprising plural wiring lines making corresponding, plural external connections with the semiconductor element; and
first supporting members extending, in spaced relationship, from the first edge of the stage and second supporting members extending, in spaced relationship, from the second edge of the stacked layer structure, the first and second supporting members extending toward the circuit board and having respective first and second portions extending in respective, different first and second directions parallel to the surface of and contacting the circuit board thereby to support the stage with the semiconductor element and the stacked layer structure in the vertically oriented position thereof above the circuit board.

21. A semiconductor device having first and second parallel main surfaces of a common, generally rectangular configuration of length and height dimensions substantially greater than a thickness dimension between the first and second parallel main surfaces, comprising:
a stage of said generally rectangular configuration and having a semiconductor element mounting position thereon;
a stacked layer structure comprising a plurality of wiring boards, each of said plurality of wiring boards having said generally rectangular configuration, and said plurality of wiring boards being arranged in parallel and stacked relationship, said stacked layer structure further having a plate layer of said generally rectangular configuration, said stacked layer structure defining a central window therein and being secured to the stage with the window disposed in surrounding relationship relative to the semiconductor element mounting position of the stage;
said stage further comprising respective first supporting members extending from opposite end portions of the first edge of the stage and the first supporting members including corresponding, first terminal portions extending transversely to the parallel main surfaces; and
said stacked layer structure further comprising respective second supporting members extending from opposite end portions of the second edge of the stacked layer structure and the second supporting members including corresponding, second terminal portions extending transversely to the parallel main surfaces.

* * * * *

UNITED STATES PATENT AND TRADEMARK OFFICE
CERTIFICATE OF CORRECTION

PATENT NO. : 5,451,815
DATED : Sep. 19, 1995
INVENTOR(S) : TANIGUCHI et al.

It is certified that error appears in the above-indentified patent and that said Letters Patent is hereby corrected as shown below:

Col. 1, line 15, delete "made to";
line 44, after "engaged" insert --,--.

Col. 8, line 31, change "stackedlayer" to --stacked layer--;

Signed and Sealed this

Ninth Day of January, 1996

Attest:

BRUCE LEHMAN

Attesting Officer          Commissioner of Patents and Trademarks